United States Patent
Goh et al.

(10) Patent No.: US 7,615,410 B2
(45) Date of Patent: Nov. 10, 2009

(54) CHIP-SIZED FLIP-CHIP SEMICONDUCTOR PACKAGE AND METHOD FOR MAKING THE SAME

(75) Inventors: Koh Hoo Goh, Muar Johor (MY); Bun-Hin Keong, Muar Johor (MY); Abdul Rahman Mohamed, Johor (MY)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 11/456,978

(22) Filed: Jul. 12, 2006

(65) Prior Publication Data

US 2007/0029666 A1 Feb. 8, 2007

Related U.S. Application Data

(63) Continuation of application No. PCT/IB2004/000047, filed on Jan. 13, 2004.

(51) Int. Cl.
*H01L 21/44* (2006.01)
*H01L 21/48* (2006.01)

(52) U.S. Cl. ............... 438/108; 257/778; 257/E21.502; 438/113

(58) Field of Classification Search ................. 257/723, 257/E21.502, E23.021; 438/108, 464, 462, 438/458
See application file for complete search history.

(56) References Cited

U.S. PATENT DOCUMENTS

| 5,739,053 | A |   | 4/1998 | Kawakita et al. ............. 438/108 |
| 5,863,813 | A | * | 1/1999 | Dando .......................... 438/114 |
| 6,040,204 | A | * | 3/2000 | Herden et al. ................ 438/109 |
| 6,083,811 | A | * | 7/2000 | Riding et al. ................ 438/460 |
| 6,338,988 | B1 | * | 1/2002 | Andry et al. ................ 438/158 |
| 6,348,399 | B1 | * | 2/2002 | Lin ............................. 438/616 |
| 6,562,647 | B2 |   | 5/2003 | Zandman et al. .............. 438/33 |
| 6,908,784 | B1 | * | 6/2005 | Farnworth et al. .......... 438/106 |
| 2001/0018229 | A1 |   | 8/2001 | Kato et al. ................... 438/106 |
| 2002/0011667 | A1 | * | 1/2002 | Sakazaki et al. ............ 257/741 |
| 2002/0041019 | A1 |   | 4/2002 | Gang ........................ 257/678 |
| 2003/0011058 | A1 | * | 1/2003 | Sakamoto et al. ........... 257/678 |

(Continued)

FOREIGN PATENT DOCUMENTS

EP 1179844 A2 2/2002

(Continued)

OTHER PUBLICATIONS

C. Dustin Johnson et al., Wafer Scale Packaging Based on Underfill Applied at the Wafer Level for Low-Cost Flip Chip Processing, Electronic Components and Technology Conference, pp. 950-954, 1999.

(Continued)

*Primary Examiner*—Wael Fahmy
*Assistant Examiner*—Sarah K Salerno
(74) *Attorney, Agent, or Firm*—Banner & Witcoff, Ltd.

(57) ABSTRACT

A semiconductor package (10; 14) comprises a semiconductor die (2; 2') with a plurality of contact areas (4) on its active surface and an electrically conductive bump (7) on each contact area (4). The die (2; 2') and electrically conductive bumps (7) are encapsulated in a plastic housing (11) so that the plastic housing (11) encapsulates at least sides of the die (2; 2') and sides of the electrically conductive bumps (7).

15 Claims, 2 Drawing Sheets

U.S. PATENT DOCUMENTS

| | | |
|---|---|---|
| 2003/0094695 A1 | 5/2003 | Hedler et al. ............... 257/737 |
| 2003/0207498 A1 | 11/2003 | Islam et al. ................. 438/120 |
| 2004/0040740 A1 | 3/2004 | Nakatani et al. ............ 174/256 |

FOREIGN PATENT DOCUMENTS

| | | |
|---|---|---|
| JP | 9275107 | 10/1997 |
| JP | 09275107 A * | 10/1997 |
| WO | 0169670 A1 | 9/2001 |

OTHER PUBLICATIONS

International Search Report with Written Oppinion, PCT/IB2004/000047, 9 pages, Jul. 27, 2005.

* cited by examiner

CHIP-SIZED FLIP-CHIP SEMICONDUCTOR PACKAGE AND METHOD FOR MAKING THE SAME

CROSS-REFERENCE TO RELATED APPLICATION

This application is a continuation of co-pending International Application No. PCT/IB2004/000047 filed Jan. 13, 2004, which designates the United States.

TECHNICAL FIELD

The invention relates to a chip-sized flip-chip semiconductor package and to a method for assembling such a semiconductor package.

BACKGROUND

U.S. Pat. No. 6,562,647 B2 shows a semiconductor package by which contacts are made to both sides of the dice manufactured on a wafer scale. The back side of the wafer is attached to a metal plate. The scribe lines separating the dice are saw cut to expose the metal plate but the cuts do not extend through the metal plate. After a metal layer is formed on the front of the dice, a second set of saw cuts are made coincident with the first set of saw cuts using a blade that is narrower than the blade used to make the first set of saw cuts.

The packaging of flip-chip semiconductor packages is known from Johnson et al IEEE Electronic Components and Technology Conference 1999 page 950 to 954 to be complex and time-consuming.

SUMMARY

A method to assemble a semiconductor package may comprise the steps of providing a semiconductor wafer including a plurality of dies, each having a plurality of contact areas on its active surface, cutting the wafer to form individual dies, attaching a first adhesive foil to the passive side of the dies, providing a substrate including a plurality of electrically conductive bumps on its surface, laterally aligning the first adhesive foil including the dies and the substrate including the electrically conductive bumps, so that the electrically conductive bumps face and are essentially vertically aligned with the contact areas on the active surfaces of the dies, pressing the first adhesive foil and the substrate together and heating to form connections between the contact areas on the dies and the substrate, removing the first adhesive foil, embedding the plurality of dies in a mold mass so that at least sides of each die and sides of the electrically conductive bumps are encapsulated by the mold mass, removing the substrate to expose the ends of the electrically conductive bumps on the surface of the mold mass, attaching a second adhesive foil to the side of the mold mass opposite the surface including the electrically conductive bumps or attaching a second adhesive foil to the passive surfaces of the dies, and cutting the mold mass to form encapsulated semiconductor packages.

BRIEF DESCRIPTION OF THE DRAWINGS

Embodiments will now be described by way of example with reference to the drawings.

DETAILED DESCRIPTION

Figure 1:
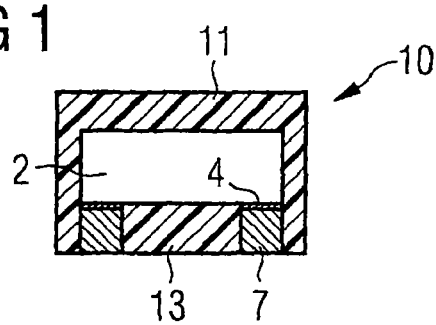
FIG. 1 shows a cross-sectional view of a semiconductor package assembled according to the described method.

A chip-sized flip-chip semiconductor package comprising a semiconductor die with a plurality of contact areas on its active surface is provided. An electrically conductive bump or solder ball is connected to each contact area. The die and electrically conductive bumps are encapsulated in a plastic housing so that the plastic housing or mold material encapsulates sides of the die and sides of the electrically conductive bumps. The passive back side of the die remains uncoated. The electrically conductive bumps provide the external electrical connection of the device to, for example, a printed board or a re-distribution board.

The package according to an embodiment can be manufactured very cost effectively as it is produced by wafer-scale processing. This enables a large number of dies to be processed in one step. The encapsulation of the sides of the electrically conductive bumps, which are attached to the contact areas on the active surfaces of the dies, is advantageous as the plastic housing provides mechanical support to the electrically conductive bumps. Thus the reliability of the package is improved.

The plastic housing of the semiconductor package according to an embodiment may preferably substantially fill the area between the electrically conductive bumps and the active surface of the die. Preferably the external ends of the electrically conductive bumps may have a substantially flat surface and form a substantially flat surface adjacent to the outer substantially flat surface of the plastic housing of the package. The electrically conducting bumps may preferably comprise solder, solder paste, electrically conductive paste or solder balls.

The substantially flat outer surface of the package including the substantially flat electrical connection areas is advantageous. Firstly, the delicate electrical connections formed between the contact areas of the die and electrically conductive bumps are provided with mechanical support by the plastic encapsulation. The semiconductor package according to an embodiment is, therefore, more reliable.

The external electrical connections formed by the exposed ends of the electrically conductive bumps have an essentially flat surface forming essentially flat contact areas. In a conventional flip-chip package the solder balls protrude from the plastic housing. The outer essentially flat surface of the package including the essentially flat contact areas according to an embodiment can be advantageous as it enables the package to be mounted onto the contact areas of a re-distribution board so that the gap between the package and board is virtually eliminated. This means that the problems associated with underfilling the mounted die during the encapsulation process are avoided. This leads to a much improved reliability of the package.

In one embodiment, the passive rear side of the die is not covered by mold material. This is advantageous if, for example, a heat spreading or heat dissipating device is to be attached to the package. The direct attachment of the heat spreader to the passive surface of the die leads to improved thermal contact and therefore improved heat dissipation.

Alternatively, the dies are completely encapsulated by the mold mass. This has the advantage of providing improved protection of the package from environmental effects. In this embodiment, an encapsulated chip-sized flip-chip semiconductor package is mounted onto the printed board or redistribution board.

The present application also relates to methods of assembling such chip-sized flip-chip semiconductor packages.

The method comprises the steps of cutting a semiconductor wafer, which includes a plurality of semiconductor dies, to form an array of individual dies with the same lateral arrangement as they had previously within the wafer. Each die includes a plurality of contact areas on its active surface. The dies are preferably arranged in columns and rows in a square grid array in the wafer. This enables a simple sawing procedure to be used to separate the dies.

A first adhesive foil is then attached to the passive back side of the dies. A substrate including a plurality of electrically conductive bumps is provided. The electrically conducting bumps are deposited on the substrate by conventional processes.

The first adhesive foil including the dies and the substrate including the electrically conductive bumps are laterally aligned so that the electrically conductive bumps face, and are essentially vertically aligned with, the contact areas on the active surfaces of the dies. The first adhesive foil and the substrate are pressed together and heated to form connections between the contact areas on the die and the substrate. The pressure and heat are then removed and the first adhesive foil is removed from the passive surface of the dies.

In the next step of the process, the plurality of dies are embedded in a single mold mass so that at least sides of each die and sides of the electrically conductive bumps are encapsulated by the mold material of the mold mass. The mold material may comprise any plastic or molding compound.

The substrate is then removed from the mold mass. This exposes the ends of the electrically conductive bumps on the surface of the mold mass and forms the essentially flat contact areas of the package. A second adhesive foil is attached to the surface of the mold mass opposite the surface of the mold mass including the exposed electrically conductive bumps. The mold mass is then cut to form a plurality of chip-sized flip-chip semiconductor packages which are still attached to the second adhesive foil.

The semiconductor packages are tested, removed from the adhesive foil and mounted in packaging tape.

During the molding process according to an embodiment, the mold material of the mold mass may preferably fill the areas between the solder balls, the active surface of the die and the upper surface of the substrate. In an alternative embodiment the mold mass additionally may encapsulate the passive surface of the dies so that the die is completely encapsulated in the mold mass.

The connection of the electrically conductive bumps between the contact areas of the dies and the substrate is preferably formed by positioning the adhesive foil containing the dies over the substrate including the electrically conductive bumps. This arrangement is advantageous if the electrically conducting bumps are not mechanically attached to the substrate. Alternatively, the substrate including the electrically conductive bumps is positioned over the adhesive foil containing the dies.

The lateral arrangement of the electrically conductive bumps is preferably a mirror image of the arrangement of the contact areas of the dies. This enables the arrangement of the contact areas of the dies to match the arrangement of the electrically conductive bumps on the substrate.

The substrate may comprise metal, ceramic or plastic. The adhesive foil may comprise an adhesive layer on a metal, ceramic or plastic sheet or plate as an alternative to conventional adhesive foil. During the pressing step of the process, additional plates may be positioned on one or both of the back surfaces of the adhesive foil or the substrate in order to provide a more homogeneous pressure.

The substrate is preferably chemically removed from the mold mass containing the plurality of embedded dies with electrically conductive bumps by, for example, an etching process. This is advantageous as mechanical stress on the electrically conductive bumps and mold mass is largely avoided. Alternatively, the substrate may be mechanically removed by, for example, a grinding process. This is advantageous if a thick substrate is used.

Alternatively, the first adhesive foil may be laterally stretched to increase the distance between the dies. This enables a thicker plastic coating on the sides of the packages and after they are separated from the mold mass. This enables improved protection of the package. If a wafer saw is used to separate the packages from the mold mass, this embodiment allows a thicker saw blade to be used. This is advantageous as a thicker blade is more robust. Also the alignment of the saw blade between the dies of the packages is simplified.

As an alternative, the package may include electrical connections which protrude from the plastic housing. This alternative embodiment is fabricated using the method except that a substrate which includes recesses arranged in a mirror image of the arrangement of the contact areas can be used. The electrically conductive bumps are then positioned at least partly in the recesses of the substrate. This method results in a package in which the electrically conductive bumps from contacts which protrude from the plastic housing of the package.

Wafer-sized processing is advantageous as the speed of the bonding process is significantly increased over a one die at a time methodology. Wafer-sized processing also reduces production costs, material wastage and a greater throughput in the manufacturing process can be achieved. A large quantity of dies, 100,000 or more is possible, can be bonded at the same time and productivity is significantly increased.

FIG. 1 shows an encapsulated semiconductor package 10 assembled using the method. The package 10 includes a semiconductor die 2 with a plurality of contact areas 4 on its active surface. A solder ball 7 is mounted on each contact area 4. The die 2 and solder balls 7 are encapsulated in a plastic housing 11. The plastic housing 11 encapsulates the die 2 and the space 13 between the solder balls 7. The end surfaces of the solder balls 7 form a flat surface adjacent to the flat outer surface of the plastic housing 11. The flat external surfaces of the solder balls 7 form the external contacts of the package.

Figure 2:
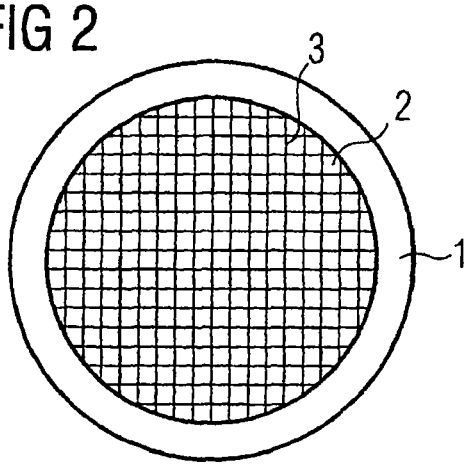
FIG. 2 shows a top view of a semiconductor wafer including a plurality of dies.

FIG. 2 shows a semiconductor wafer 1 comprising a plurality of dies 2 arranged in a two-dimensional square grid array, defined by sawing grooves 3. For improved clarity, only one of the plurality of dies 2 and sawing grooves 3 are indicated by a reference number. Each die 2 includes one or more semiconductor devices and a plurality of contact areas 4 on its active surface which cannot be seen in FIG. 2. The wafer 1 is cut along the sawing grooves 3 to separate the wafer 1 into a plurality of dies 2 having the same lateral arrangement as they had previously within the wafer 1.

Figure 3:
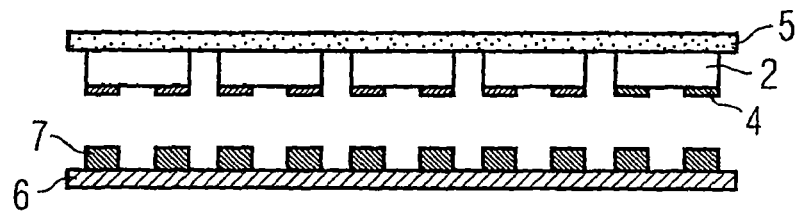
FIG. 3 shows the positioning of the dies of FIG. 2 above a substrate including a plurality of solder balls.

FIG. 3 shows that a first adhesive foil 5 is then attached to the passive back side of the separated dies 2. The first adhesive foil 5 is orientated horizontally so that the contact areas 4 of the dies 2 face downwards. A substrate 6 which is laterally at least as large as the wafer 1 is provided with a plurality of solder balls 7 arranged on its upper surface. The lateral arrangement of the solder balls 7 substantially matches the arrangement on the contact areas 4 on the dies 2 when the first adhesive foil 5 is positioned over the substrate. The lateral arrangement of the solder balls 7 is substantially a mirror image of the lateral arrangement of the contact areas 4. The substrate 6 including the solder balls 7 is positioned beneath the first adhesive foil 5 including the semiconductor dies 2 so that the contact areas 4 of the dies 2 face and are positioned directly above the solder balls 7.

Figure 4:
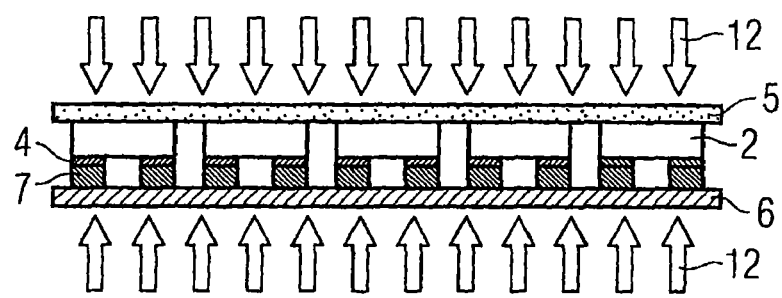
FIG. 4 shows the attachment of the solder balls of FIG. 3 to the contact areas of the dies.

FIG. 4 shows that in the next step of the process the first adhesive foil 5 including the dies 2 and substrate 6 including the solder balls 7 are brought together so that the upper surface of the solder balls 7 are in contact with the surface of the corresponding contact areas 4 and the substrate 6. Heat and a compressive force is applied so that the solder ball 7 is bonded to the contact area 4. This process or solder reflow is illustrated by a plurality of arrows 12 in FIG. 4. The heat and force are removed, then the first adhesive foil 5 is removed leaving an array of dies 2 bonded via the solder balls 7 to the substrate 6.

Figure 5:
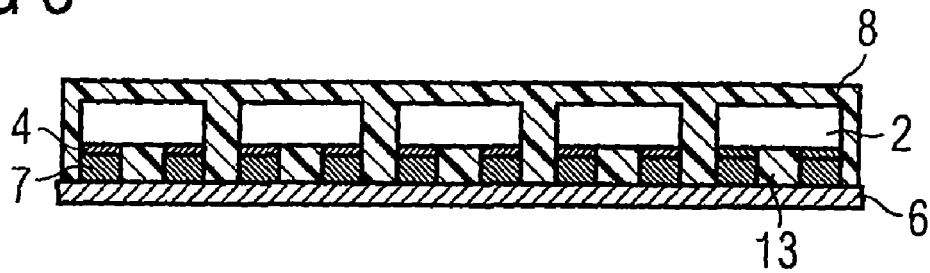
FIG. 5 shows the encapsulation of the dies of FIG. 4 in a single mold mass.

In the next step, FIG. 5, the substrate including the attached dies 2 is covered by mold material to form a mold mass 8 so that the passive surface and sides of each die 2 and sides of solder balls 7 are encapsulated. The space 13 between the solder balls 7, active surfaces of the dies 2 and upper surface of the substrate 6 is also filled by the mold material of the mold mass 8. All of the attached dies 2 and the upper surface of the substrate 6 are covered by a single mold mass 8.

Figure 6:
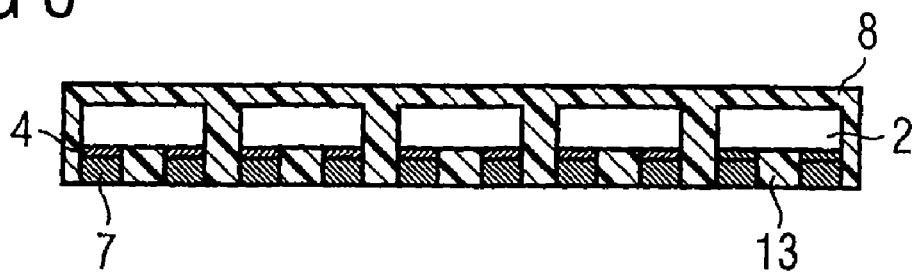
FIG. 6 shows the removal of the substrate of FIG. 5 from the mold mass.

In the next step, shown in FIG. 6, the substrate 6 is removed from the mold mass 8, which includes the encapsulated dies 2 and solder balls 7, by an etching process. The bottom surfaces of the solder balls 7, which were previously in contact with the substrate 6, are exposed in the bottom surface of the mold mass 8 by this process. The exposed surfaces of the solder balls 7 and the bottom surface of the mold mass 8 form a common essentially flat surface.

Figure 7:
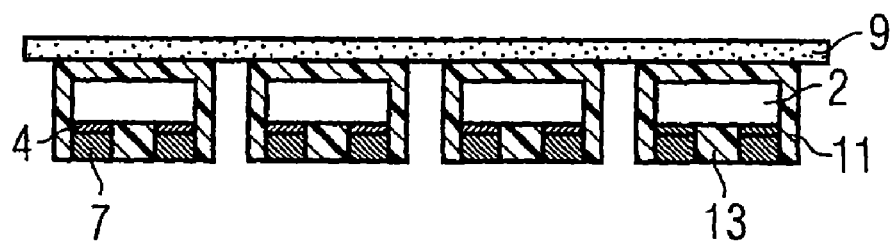
FIG. 7 shows the separation of encapsulated semiconductor packages of FIG. 6 from the mold mass.

In the next step, shown in FIG. 7, a second adhesive foil 9 is placed onto the upper surface of the mold mass 8. The mold mass is cut between the dies 2 to form separate encapsulated semiconductor packages 10 which are still attached to the second adhesive foil 9. In the next step the individual encapsulated chip-sized flip-chip semiconductor packages 10 are tested, removed from the adhesive foil 9 and packed into a packing tape. These steps are not illustrated by a Figure.

Figure 8:
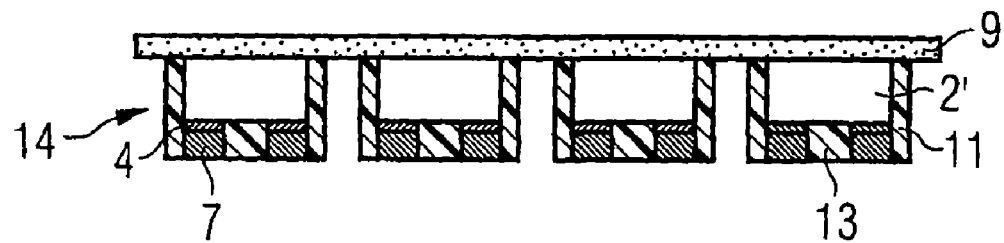
FIG. 8 shows the method step of FIG. 7 for an alternative embodiment.

FIG. 8 shows the method step of FIG. 7 for an alternative embodiment. Semiconductor package 14 comprises a semiconductor die 2' which includes a plurality of contacts areas 4, which are not shown in the diagram, on its active surface. A solder ball 7 is attached to each contact area. In this embodiment, the plastic housing 11 of each semiconductor package 14 covers sides of the dies 2' and solder balls 7 and fills the space 13 between the solder balls 7 and active surface of the die 2'. The passive rear side of the die 2' is not covered by the plastic housing 11. The end surfaces of the solder balls 7 form a essentially flat surface adjacent to the essentially flat outer surface of the plastic housing 11.

In this alternative embodiment the method steps are the same as those shown in FIGS. 2 to 7 except that the passive back surface of the dies 2' is not encapsulated by a mold mass. The second adhesive foil 9 is attached to the passive back surface of the dies 2' and the mold mass cut between the dies 2' to form a plurality of packages 14 which are attached to the second adhesive foil 9.

The encapsulated or partially encapsulated chip-sized flip-chip semiconductor packages 10; 14 made by the method are then mounted on a conventional printed board or re-distribution board.

What is claimed is:

1. A method to assemble a semiconductor package comprising:
   providing a semiconductor wafer including a plurality of dies, each having a plurality of contact areas on its active surface,
   cutting the wafer to form a plurality of individual dies,
   attaching a first adhesive foil to a passive surface of the plurality of individual dies,
   providing a substrate including a plurality of electrically conductive bumps on its surface,
   laterally aligning the first adhesive foil including the plurality of individual dies and the substrate including the electrically conductive bumps, so that the electrically conductive bumps face and are vertically aligned with the contact areas on the active surfaces of the plurality of individual dies,
   pressing the first adhesive foil and the substrate together and heating to form connections between the contact areas on the plurality of individual dies and the substrate,
   removing the first adhesive foil,
   embedding the plurality of individual dies in a mold mass so that at least sides of each die and sides of the electrically conductive bumps are encapsulated by the mold mass,
   removing the substrate to expose the ends of the electrically conductive bumps on a surface of the mold mass,
   attaching a second adhesive foil to a side of the mold mass opposite the surface including the electrically conductive bumps, and
   cutting the mold mass to form encapsulated semiconductor packages.

2. The method according to claim 1, further comprising testing the semiconductor packages, removing them from the second adhesive foil, and mounting them in packaging tape.

3. The method according to claim 1, further comprising positioning the substrate including the electrically conductive bumps over the first adhesive foil including the plurality of individual dies.

4. The method according to claim 1, further comprising positioning the first adhesive foil including the plurality of individual dies over the substrate including the electrically conductive bumps.

5. The method according to claim 1, wherein the first or second adhesive foil comprises an adhesive layer on a metal, ceramic or resin foil or sheet.

6. The method according to claim 1, further comprising stretching the first adhesive foil including the plurality of individual dies to increase lateral separation of the plurality of individual dies.

7. The method according to claim 1, wherein the mold mass fills the area between the electrically conducting bumps and the active surface of the plurality of individual dies.

8. The method according to claim 1, wherein the passive surface of the plurality of individual dies is encapsulated by the mold mass.

9. A method to assemble a semiconductor package comprising:

providing a semiconductor wafer including a plurality of dies, each having a plurality of contact areas on its active surface, cutting the wafer to form a plurality of individual dies, attaching a first adhesive foil to a passive surface of the plurality of individual dies, providing a substrate including a plurality of electrically conductive bumps on its surface, laterally aligning the first adhesive foil including the plurality of individual dies and the substrate including the electrically conductive bumps, so that the electrically conductive bumps face and are vertically aligned with the contact areas on the active surfaces of the plurality of individual dies, pressing the first adhesive foil and the substrate together and heating to form connections between the contact areas on the plurality of individual dies and the substrate, removing the first adhesive foil, embedding the plurality of individual dies in a mold mass so that at least sides of each die and sides of the electrically conductive bumps are encapsulated by the mold mass, removing the substrate to expose the ends of the electrically conductive bumps on a surface of the mold mass, attaching a second adhesive foil to the passive surfaces of the plurality of individual dies, and cutting the mold mass to form encapsulated semiconductor packages.

10. The method according to claim 9, further comprising testing the semiconductor packages, removing them from the second adhesive foil, and mounting them in packaging tape.

11. The method according to claim 9, further comprising positioning the substrate including the electrically conductive bumps over the first adhesive foil including the plurality of individual dies.

12. The method according to claim 9, further comprising positioning the first adhesive foil including the plurality of individual dies over the substrate including the electrically conductive bumps.

13. The method according to claim 9, wherein the first or second adhesive foil comprises an adhesive layer on a metal, ceramic or resin foil or sheet.

14. The method according to claim 9, further comprising stretching the first adhesive foil including the plurality of individual dies to increase lateral separation of the plurality of individual dies.

15. The method according to claim 9, wherein the mold mass fills an area between the electrically conducting bumps and the active surface of the die, and wherein the passive surface of the dies is encapsulated by the mold mass.

* * * * *